United States Patent [19]

Nelson

[11] 4,253,159
[45] Feb. 24, 1981

[54] ION-IMPLANTED BUBBLE MEMORY WITH REPLICATE PORT

[75] Inventor: Terence J. Nelson, New Providence, N.J.

[73] Assignee: Bell Telephone Laboratories, Incorporated, Murray Hill, N.J.

[21] Appl. No.: 99,536

[22] Filed: Dec. 3, 1979

[51] Int. Cl.³ ............................................. G11C 19/08
[52] U.S. Cl. ....................................... 365/36; 365/12; 365/15; 365/41
[58] Field of Search ....................... 365/15, 12, 36, 41, 365/13

[56] References Cited

U.S. PATENT DOCUMENTS

| | | |
|---|---|---|
| 4,014,009 | 3/1977 | Bonyhard et al. ...................... 365/15 |
| 4,020,476 | 4/1977 | Bonyhard et al. ...................... 365/15 |
| 4,086,571 | 5/1978 | Bullock .................................. 365/12 |

OTHER PUBLICATIONS

Journal of Vacuum Science & Technology–vol. 15, No. 5, Sep./Oct. 1978, pp. 1675–1684.

*Primary Examiner*—James W. Moffitt
*Attorney, Agent, or Firm*—Herbert M. Shapiro

[57] ABSTRACT

A replicator for an ion-implanted magnetic bubble memory includes an offset hairpin geometry. The conductor is associated with features in adjacent bubble paths which exhibit strong attracting poles at the same time. The conductor stretches the bubble between the attracting poles. The bubble is severed by the reorienting propagation field.

9 Claims, 5 Drawing Figures

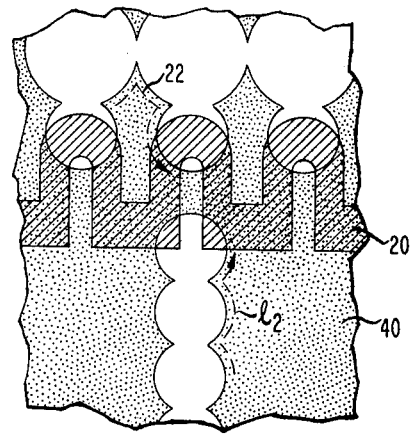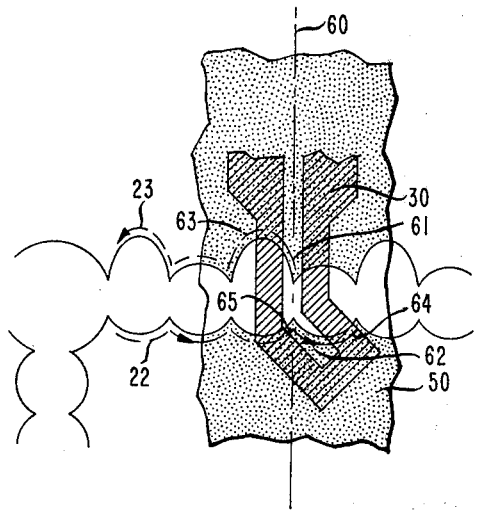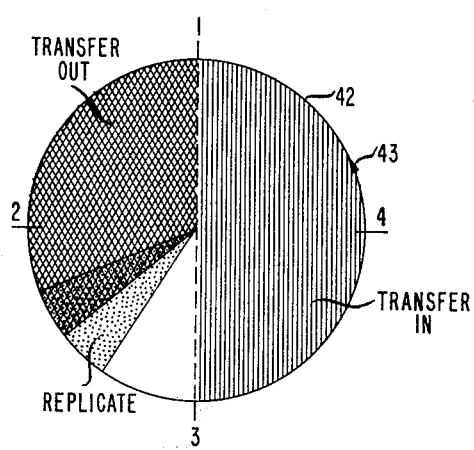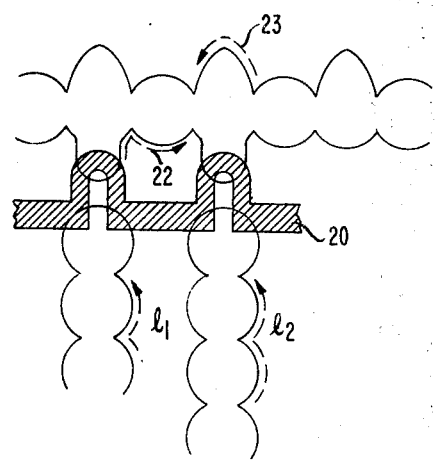

ION-IMPLANTED BUBBLE MEMORY WITH REPLICATE PORT

FIELD OF THE INVENTION

This invention relates to magnetic bubble memories and more particularly to such memories including replicate ports.

BACKGROUND OF THE INVENTION

A typical magnetic bubble memory is organized in a major-minor mode as first disclosed in U.S. Pat. No. 3,618,054, of P. I. Bonyhard, U. F. Gianola and A. J. Perneski issued Nov. 2, 1971. Such a memory includes a plurality of closed loop paths, called minor loops, in which bubble patterns move synchronously in response to a magnetic field reorienting in the plane of bubble movement.

Data is read out of the minor loops and written into the minor loops by means of an accessing path to which a bubble generator and a bubble detector are coupled. The accessing path comprises a bubble path or loop coupled to all the minor loops at reference positions at which the loop ends and associated stages of the major path or loop come into close proximity. An electrical conductor couples those positions in a manner to transfer or replicate a bubble pattern from, say, the minor loops to the major path or loop.

The organization of the major path or loop depends on whether a transfer or a replicate function is to occur between that path or loop and the minor loops. If a transfer function is to occur, that operation transfers the bubbles in the reference positions during a selected cycle of the in-plane field and leaves vacancies behind. The transferred pattern and the vacancies move synchronously in their respective paths or loops to return to the reference positions for movement of the transferred pattern, or an image thereof, back into the vacancies from which they originated. It is clear then that a transfer operation employs a major loop rather than a major path and that every transfer of a bubble pattern out of the minor loops is followed ultimately by a transfer of data back into the minor loops.

The major loop is organized differently when a replication function is performed at the reference positions. In that case, vacancies are not created when a bubble pattern moves to the major path. Rather an image of that pattern is produced by replication. Thus, the major path is a path and not a loop because the image need not be recirculated to be reunited with vacancies as is the case when transfer occurs.

The advantages of replication over transfer are well known. If replication is employed, data loss during power failures is a trivial problem because the data is still present in the selected memory address. Only the image can be lost. Further, replication permits faster operation because the image, once detected, may be destroyed rather than returned to vacancies. The latter operation requires considerable movement of data and occupies the major loop for a considerable time over that required for replication.

A further use for a replicate port is in the major path itself. For example, at present, destructive-read detector arrangements for ion-implanted bubble memories have better operating margins than nondestructive-read arrangements. But a destructive-read arrangement preceded by a replicate port operates as a nondestructive-read arrangement by generating an image of the data for return to the minor loops.

Commercially available magnetic bubble memories have major and minor paths defined by permalloy elements of the type disclosed in U.S. Pat. No. 4,014,009 of P. I. Bonyhard, Y. S. Chen and J. L. Smith issued Mar. 22, 1977. Such memories in which the paths are defined by ion-implantation are disclosed in U.S. Pat. No. 3,792,452, of M. Dixon, R. A. Moline, J. L. Horth, L. J. Varnerin, and R. Wolfe, issued Feb. 12, 1974. It is to magnetic bubble memories of the ion-implanted type that this invention is directed, the specific problem being that a replicate port for major-minor, ion-implanted bubble memories does not exist.

There is a good reason why replicate ports in such ion-implanted memories have eluded bubble circuit designers. Ion-implanted elements for moving magnetic bubbles in response to a reorienting magnetic in-plane field are characterized by charged walls which extend outwardly from the elements and thus cause bubble elongation also outwardly from the elements. But bubble replication, in permalloy circuits, has been performed by actively cutting a bubble which elongates along an edge of a permalloy element astride, for example, a portion of a conductor element which produces a (bubble-) collapsing field in response to the applied current. Unless the bubble extends across the conductor element, no such replication is possible. Unless each end of a bubble terminates on a strong attractive pole, bubble oscillation rather than replication occurs.

Replication functions often are implemented by electrical conductor patterns which are formed beneath the permalloy elements (in permalloy circuits) about which bubbles are elongated during bubble propagation in response to cycles of the in-plane field. Successful replication depends on proper placement of the conductors to produce cutting fields at a position across which a bubble is elongated (stretched). In this instance also, without strong poles on which to terminate, an elongated bubble merely oscillates rather than replicates. Certainly, at least an elongated bubble is not divided into two predictably, and certainly does not result in two bubbles at predictable positions.

With ion-implanted circuits, no anchoring of an elongated bubble appears possible. The reason for this is that one end of a charge wall extends like a spike outwardly from the propagation elements to occupy varying (rather than fixed) positions. Further, the end of the spike coupled to the propagation elements is mobile. Consequently, the positioning of a replicate conductor astride a bubble elongated by a charge wall has not led to successful replication.

BRIEF DESCRIPTION OF THE ILLUSTRATIVE EMBODIMENT

The invention is based on the realization that the strategy for successful bubble replication is permalloy bubble memories, if reversed, would be successful with ion-implanted bubble memories. In permalloy bubble memories, we passively elongate a bubble and, when electrical conductors are used, actively cut the bubble into two. The term "passively" is used to indicate that elongation is responsive to the in-plane field which causes bubble propagation. Accordingly, permalloy element geometry causes bubble to elongate periodically during the bubble propagation operation. The term "actively" refers to an operation responsive to a pulse on an electrical conductor. When a replicate pulse is applied to a replicate conductor an "active" event occurs—a field of a polarity to collapse a bubble is generated to split an elongated bubble.

For ion-implanted bubble memories, a bubble is elongated actively and then passively split by strong poles of a polarity to collapse a bubble in response to the rotating field. The three fold symmetry of the (cubic) crystalline structure of the bubble layer may be turned to account to achieve relatively wide margins for the replicate function herein.

In one embodiment herein, an ion-implanted bubble memory loop having first and second legs and first and second ends, is defined by nonimplanted, contiguous disc elements having opposed bulges and cusps, the latter of which are directed into the nonimplanted areas. A replicate conductor of a hairpin geometry overlies the cusps, extending well beyond the cusps in both directions along an axis perpendicular to the paths defined by the discs. The hairpin has an offset geometry to align with strong poles generated in first and second positions which lie on first and second sides of the axis and in first and second legs of the loop respectively. The cyclical inplane field periodically causes those strong poles to occur in those first and second positions. A replicate pulse on the hairpin conductor elongates the bubble to those (secure) positions for splitting in response to poles of an opposite polarity generated strategically as the in-plane field reorients.

BRIEF DESCRIPTION OF THE DRAWING

FIGS. 2 and 4 are enlarged top views of surface features of a portion of the memory of FIG. 1, FIG. 3 is a pulse diagram of the operation of the memory of FIG. 1; and FIG. 5 is an enlarged top view of features of a portion of an alternative memory in accordance with this invention.

DETAILED DESCRIPTION

Figure 1:
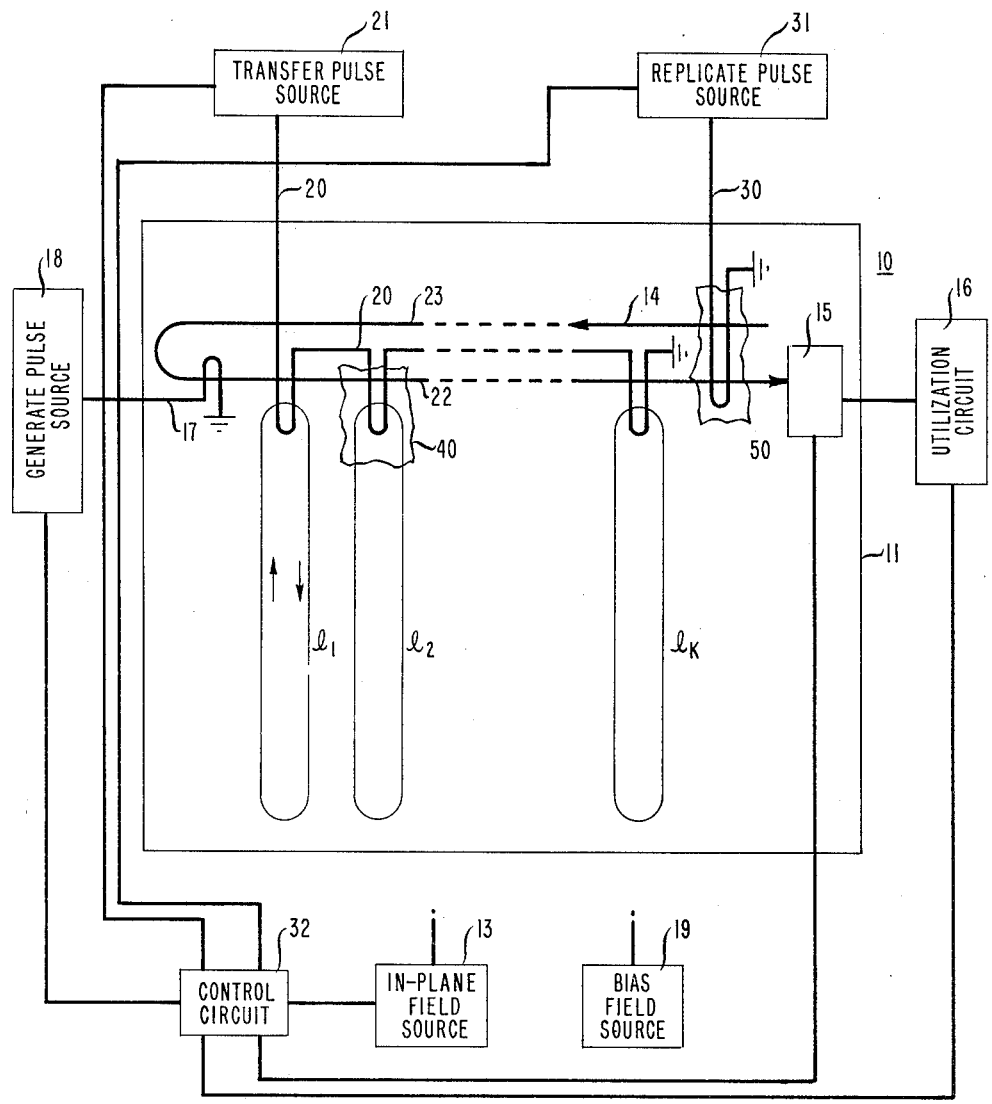
FIG. 1 is a schematic representation of a magnetic bubble memory with a replicate port in accordance with this invention.

FIG. 1 shows a magnetic bubble memory 10 including a layer 11 in which magnetic bubbles can be moved. Layer 11 includes a plurality of minor loops $l_1$, $l_2$—$l_k$ about which bubbles recirculate in response to an in-plane field reorienting in the plane of layer 11. The in-plane field is supplied by an in-plane field source represented by block 13. Layer 11 also includes major loop 14 to which a bubble detector and a bubble generator are coupled. A bubble detector is represented by block 15 and is operative responsive to the presence of a bubble to apply a signal indicative thereof to a utilization circuit represented by block 16. A bubble generator includes an electrical conductor 17 connected between a generate pulse source 18 and ground.

Bubbles are maintained at an operating diameter in layer 11 by a bias field supplied by source 19.

The major and minor loops, in the illustrative embodiment, are coupled by a transfer conductor 20 connected between a transfer pulse source 21 and ground. First and second paths 22 and 23 of major "loop" 14 are coupled by a replicate conductor 30 connected between a replicate pulse source 31 and ground. Pulse sources 18, 21 and 31 and circuits 13, 15 and 16 herein are operative under the control of control circuit 32. The various sources and circuits may be any such elements capable of operating in accordance with this invention.

The various bubble paths in layer 11 are defined by ion-implantation. In the illustrative embodiment, nonimplanted contiguous discs in an otherwise implanted layer within layer 11 define bubble propagation paths thereabout. FIG. 2 shows area 40 of FIG. 1 enlarged to show the details of the transfer ports. The ion-implanted areas are shown stippled. Path 22 of FIG. 1 is shown as a broken arrow in FIG. 2 as is minor loop $l_2$. Note that the paths of bubble movement follow the contour of the nonimplanted areas. Conductor 20 is defined by an electrical conductor pattern formed on top of layer 11 by well known techniques.

The transfer port is operative as a bidirectional port. That is to say, a bubble moving in the minor loop ($l_2$) can be transferred to path 22 by a pulse in conductor 20 when the in-plane field is in a 1 position and a bubble is at the top of the end nonimplanted disc of loop $l_2$. FIG. 3 shows a diagram of the in-plane field with the 1, 2, 3 and 4 orientations (positions) for the in-plane field demonstrated on a circle 42. The field is moving in the counterclockwise direction as indicated by arrow head 43. The transfer-out pulse on conductor 20 is initiated when the field is in the 1 position and terminates before the field reaches the 3 position as indicated by the cross hatched region designated "transfer". Similarly, transfer (in) of a bubble in path 22, originating at the generator, occurs when a bubble reaches the nonimplanted disc opposite loop $l_2$ when the field is in the 3 position. A pulse on conductor 20 at that time terminating when the field next reorients to a 1 position moves the bubble to path $l_2$. The broken line in FIG. 3 indicates the limits of the transfer-in pulse.

FIG. 4 shows an area 50 of FIG. 1 enlarged. Paths 22 and 23 of loop 14 are shown in the figure along with conductor 30. It is clear from the discussion in connection with FIG. 3 that bubbles in the minor loops are moved to path 22 leaving vacancies in the initial positions and those bubbles are returned to those vacancies during a later transfer-in operation. In order to implement such a return the major path (14) is in a sense "closed" to form a loop by properly timed replicate pulses applied to conductor 30 by source 31 of FIG. 1.

A replicate pulse is applied when a bubble is moved from left to right in path 22 in response to the inplane field orienting towards the 3 position from the 2 position as shown in FIG. 3. The bubble is just leaving the cusp and propagating towards the bulge as viewed in FIG. 4. The replicate pulse terminates before the in-plane field reorients to the 3 position as indicated by the stippled area of FIG. 3. The in-plane field in the 3 position as shown in FIG. 3, drives the encompassed cusp of path 22 to a polarity to collapse bubbles. Thus, the replicate field operates to stretch bubbles between two strong attractive poles whereas the propagate field provides the cutting field. Two bubbles result. The replicated bubble (image) is now in path 23 moving to the left synchronously with the original bubble moving right along leg 22 for detection. The image is later transferred back into the minor loops. The numbers of stages in the (now) major loop and the minor loops are chosen (to differ by one for fields rotating as shown but of equal count if the field direction is reversed for transfer in) to permit such a transfer. The difference in count is to enable a satisfactory power-down sequence to be realized in an organization using a bidirectional transfer port.

The replicate function requires the movement of a bubble through a nonimplanted region. This action is rendered permissible by a uniform ion-implanted layer usually occupying a surface region of layer 11. Such a uniformly implanted layer in addition to the patterned implanted layer shown in FIGS. 1, 2 and 3 is disclosed in my copending application (Case 14) Ser. No. 89,090 filed Oct. 29, 1979. Of course the number of replicate pulses equals the number of minor loops so that all the data in a selected address, transferred out to path 22, during an address select operation, is replicated for return to the minor loops.

The geometry for path 22 in FIG. 2 shows a requirement of three cycles of the in-plane field between bits from adjacent minor loops. FIG. 5, on the other hand, shows a geometry in which adjacent bits in path 22 are spaced apart only two cycles of the in-plane field. The various elements of FIG. 5 are designated as in FIG. 2 for ease of comparison. Whatever the spacing might be between data, control circuit 32 of FIG. 1 controls the replicate pulses, accordingly, in a well understood manner.

The geometry and position of the replicate conductor is important. The area encompassed by the hairpin extends over a nonimplanted layer and encompasses and positions in opposing paths (22 and 23) both of which are poled to attract bubbles at a particular orientation of the in-plane field. In the illustrative embodiment, the end positions are chosen for a field oriented in the 3 position of FIG. 3. Such positions are offset from one another because neither opposing bulges or cusps are poled alike for any orientation of the in-plane field. Rather, like elements of opposing paths (viz. 22 and 23) are poled oppositely. Thus, with respect to an imaginary axis drawn through like elements of opposing legs as axis 60 of FIG. 4, position 61 of leg 23 and position 62 of path 22 are on opposite sides. The replicate pulse provides a stretching field when the ends of the elongated bubble are secured at those end positions and terminates before the in-plane field reorients to a 3 position. A bubble and its image occupy positions 61 and 62 in paths 23 and 22 respectively, after the pulse terminates.

The offset shape of the hairpin replicate conductor is designed, in the illustrative embodiment, to encompass two like-poled positions in opposing paths. But the two paths may be out of phase with one another, the cusps of one aligning with the bulges of the other. In such a case (not shown), the hairpin shape of the conductor would align with the axis (60 of FIG. 4). An offset would be unnecessary. In addition, positions 61 and 65 of FIG. 4 may be used to anchor an elongated bubble. In this case, the positions are not astride axis 60 and the offset is in a direction opposite to that shown in FIG. 4.

It is also important that conductor 20 extend in each direction beyond the opposing paths of bubble propagation. The reason for this is to provide a middle point in the strip to be affected by the collapsing pole when the in-plane field reorients appropriately. It has been found that when the conductor opening is not extended beyond the cusp in path 22, for example, the end of the strip is subjected to the collapsing field and the result is that the bubble may simply transfer to position 61.

What has been described is considered merely illustrative of the principle of this invention. Therefore, various embodiments can be devised by those skilled in the art in accordance with those principles within the spirit and scope of this invention as encompassed by the following claims. For example, the replicate conductor 30 herein is shown as having a hairpin geometry. But a single strand conductor can be made to operate similarly. Further, each of the transfer ports of FIGS. 1 and 2 may be replaced by the replicator of FIG. 4 to achieve a major-minor organization operative without the replicator positioned as shown in FIG. 1.

I claim:

1. A magnetic bubble memory comprising a layer of material in which magnetic bubbles can be moved along at least first and second paths in response to a cyclical magnetic field, said layer including a pattern of alternating first and second ion-implanted features for defining each of said first and second paths, like features of said paths exhibiting like magnetic polarity for said field oriented in a first direction, an electrical conductor extending between said first and second paths in a manner to extend between unlike features, of said first and second paths, said features being like poled when said field is in said first direction, and means for pulsing said conductor at a time when said field is in said first direction.

2. A magnetic bubble memory in accordance with claim 1 wherein said conductor is hairpin in shape and encompasses said unlike features.

3. A magnetic bubble memory in accordance with claim 2 wherein said like ones of said alternating first and second features of said first and second paths are aligned with one another and said hairpin shaped conductor comprises an offset shape to encompass like poled unlike features of said first and second paths.

4. A magnetic bubble memory in accordance with claim 3 wherein said first and second paths are aligned in parallel with one another.

5. A magnetic bubble memory in accordance with claim 4 wherein said first and second paths are defined along opposing edges of a nonimplanted region in an ion-implanted layer.

6. A magnetic bubble memory in accordance with claim 5 wherein said first and second features are bulges and cusps defined by a succession of contiguous nonimplanted discs.

7. A magnetic bubble memory in accordance with claim 4 wherein said first and second paths are operative to move bubbles in first and second directions respectively in response to said in-plane field.

8. A magnetic bubble memory in accordance with claim 7 wherein said conductor extends beyond the axes of said first and second paths to encompass within the hairpin-shaped conductor ion-implanted areas therebeyond.

9. A magnetic bubble memory comprising a layer of material in which magnetic bubbles can be moved in response to a cyclical magnetic field, said layer including ion-implanted regions comprising alternating bulges and cusps for defining a recirculating loop for bubbles thereabout, said loop comprising first and second multi-stage paths having at least first and second cusps respectively which align along an axis, and a hairpin-shaped replicate conductor aligned with said axis and extending beyond said first and second paths, said conductor also having an offset geometry to overlie adjacent bulges to first and second sides of said axis in said first and second paths respectively.

* * * * *